United States Patent [19]

Perera

[11] Patent Number: 5,786,263
[45] Date of Patent: Jul. 28, 1998

[54] METHOD FOR FORMING A TRENCH ISOLATION STRUCTURE IN AN INTEGRATED CIRCUIT

[75] Inventor: Asanga H. Perera, Austin, Tex.

[73] Assignee: Motorola, Inc., Schaumburg, Ill.

[21] Appl. No.: 416,243

[22] Filed: Apr. 4, 1995

[51] Int. Cl.⁶ .................................................. H01L 21/76
[52] U.S. Cl. .................................. 438/431; 438/437
[58] Field of Search ............... 437/67, 72; 148/DIG. 50, 148/DIG. 85, DIG. 86; 438/431, 437, 432, 227

[56] References Cited

U.S. PATENT DOCUMENTS

| | | | |
|---|---|---|---|
| 4,523,369 | 6/1985 | Nagakubo | 437/67 |
| 4,666,556 | 5/1987 | Fulton et al. | |
| 4,714,520 | 12/1987 | Gwozdz | 437/228 |
| 4,927,780 | 5/1990 | Roth et al. | 437/69 |
| 5,112,772 | 5/1992 | Wilson et al. | 437/67 |
| 5,175,123 | 12/1992 | Vasquez et al. | |
| 5,246,537 | 9/1993 | Cooper et al. | 156/649 |
| 5,387,540 | 2/1995 | Poon et al. | 437/67 |

OTHER PUBLICATIONS

IBM Corp., 1979, "Method For Forming Shallow Junction Semiconductor Devices", pp. 4868–4870.

T.A.Shankoff et al.,"Bird's Beak Configuration & Elimination of Gate Oxide Thinning Produced during Selective Oxidation", J.Electrochem. Soc.:Solid–State Science and Tech., Jan.1980, pp. 216–222.

C.A. Goodwin et al.,"MOS Gate Oxide Defects Related to Treatment of Silicon Nitride Coated Wafers Prior to Local Oxidation", J.Electrochem. Soc.: Solid–State Sci. & Tech., May 1982, pp. 1066–1070.

G. Fuse et al., "A Practical Trench Isolation Technology With A Novel Planarization Process", Semiconductor Research Center, Matsushita Elec. Ind. Co., 732–IEDM 1987 IEEE, pp. 732–735.

*Primary Examiner*—George R. Fourson
*Attorney, Agent, or Firm*—Kent J. Cooper

[57] ABSTRACT

The reliability of integrated circuits fabricated with trench isolation is improved by forming a trench isolation structure with a void-free trench plug (36). In one embodiment, a polysilicon layer (28) is formed within a trench (22) and then subsequently oxidized to form a first dielectric layer (30). The first dielectric layer (30) is then etched and a second dielectric layer (34) is subsequently formed over the etched dielectric layer (32). A portion of the second dielectric layer (34) is then removed using chemical-mechanical polishing to form a void-free trench plug (36) within the trench (22). In addition, reliability is also improved by minimizing subsequent etching of trench plug (36) after it has been formed.

25 Claims, 4 Drawing Sheets

METHOD FOR FORMING A TRENCH ISOLATION STRUCTURE IN AN INTEGRATED CIRCUIT

FIELD OF THE INVENTION

This invention relates generally to semiconductor devices, and more specifically to a method for forming a trench isolation structure in an integrated circuit.

BACKGROUND OF THE INVENTION

The semiconductor industry continually strives to increase device performance and device density by reducing device dimensions. For a given chip size, device density can be increased by reducing the lateral distance separating active devices, or the device isolation width. The desire to reduce device isolation width, while maintaining the necessary electrical isolation between adjacent active devices, has led to the development of several different isolation schemes.

One technique which as been proposed for device isolation in high density integrated circuits is trench isolation. With trench isolation, field oxide encroachment of the surrounding active regions is eliminated, and therefore device isolation width can be reduced. Unfortunately, integrated circuits fabricated with existing trench isolation schemes often suffer from high leakage currents, and thus have poor reliability. One reason for this high leakage current is the formation of parasitic transistors along the trench sidewall. With existing trench isolation schemes the trench fill is often recessed into the trench such that a significant portion of the trench sidewall is no longer covered by the trench fill. As a result, when a transistor gate electrode is subsequently formed over an active region, which is abutting the trench sidewall, a portion of the gate electrode extends along the uncovered portion of the trench sidewall. This forms a parasitic transistor, which is in series with the conventional transistor formed along the horizontal surface of the active region. Because this parasitic transistor is formed along the trench sidewall it has a threshold voltage that is lower than that of the conventional horizontal transistor. Therefore, at voltages where the horizontal transistor is designed to be turned off the parasitic transistor continues to conduct a leakage current. In addition, the reliability of integrated circuits fabricated with existing trench isolation schemes are also adversely affected by isolation trenches that have voids or keyholes formed within them. If these voids or keyholes become exposed during the trench planarization process, then adjacent gate electrodes can be shorted to one another by conductive filaments subsequently formed within the void or keyhole. Moreover, void formation becomes more problematic as trench widths decrease and the aspect ratio of the trenches increases in order to meet high density integrated circuit requirements. Accordingly, a need exists for a trench isolation structure that allows high density integrated circuits to be fabricated with improved reliability.

DETAILED DESCRIPTION OF A PREFERRED EMBODIMENT

Figure 1:
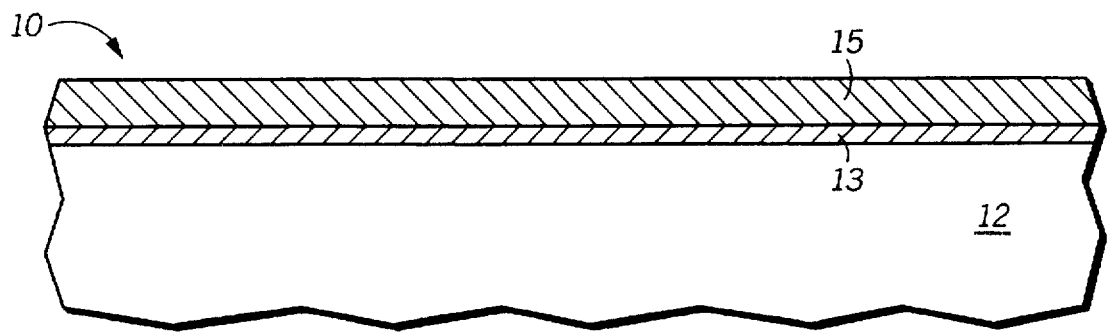
FIGS. 1–11 illustrate, in cross-section, process steps in accordance with one embodiment of the invention.

FIGS. 1 through 11 illustrate, in cross-section, process steps in accordance with one embodiment of the invention wherein a trench isolation structure is formed in an integrated circuit. Shown in FIG. 1 is a portion 10 of an integrated circuit structure comprising a semiconductor substrate 12, a buffer layer 13, and an oxidation resistant layer 15. Semiconductor substrate 12 is preferably a monocrystalline silicon substrate. Alternatively, semiconductor substrate 12 can also be a silicon on insulator substrate, a silicon on sapphire substrate, or the like. Buffer layer 13 is preferably a layer of thermally grown silicon dioxide having a thickness ranging from 10 to 25 nanometers. Alternatively, buffer layer 13 can be chemical vapor deposited silicon dioxide. Following the formation of buffer layer 13, oxidation resistant layer 15 is formed over buffer layer 13. Oxidation resistant layer 15 is preferably chemical vapor deposited silicon nitride having a thickness ranging from 50 to 200 nanometers. Alternatively, oxidation resistant layer 15 can also be another material, such as silicon oxynitride.

Figure 2:
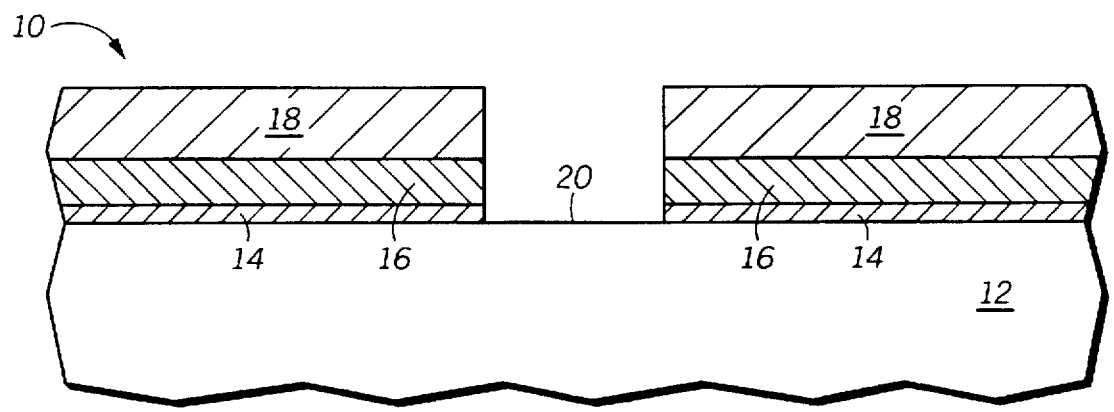

In FIG. 2, a photoresist mask 18, which overlies a portion of oxidation resistant layer 15, is used to pattern oxidation resistant layer 15 and underlying buffer layer 13 so that a remaining portion 16 of oxidation resistant layer 15 is left overlying a remaining portion 14 of buffer layer 13, and a first portion 20 of semiconductor substrate 12 is exposed. Photoresist mask 18 can be formed using standard photolithographic patterning processes, and oxidation resistant layer 15 and buffer layer 13 can be patterned using standard etching techniques.

Figure 3:
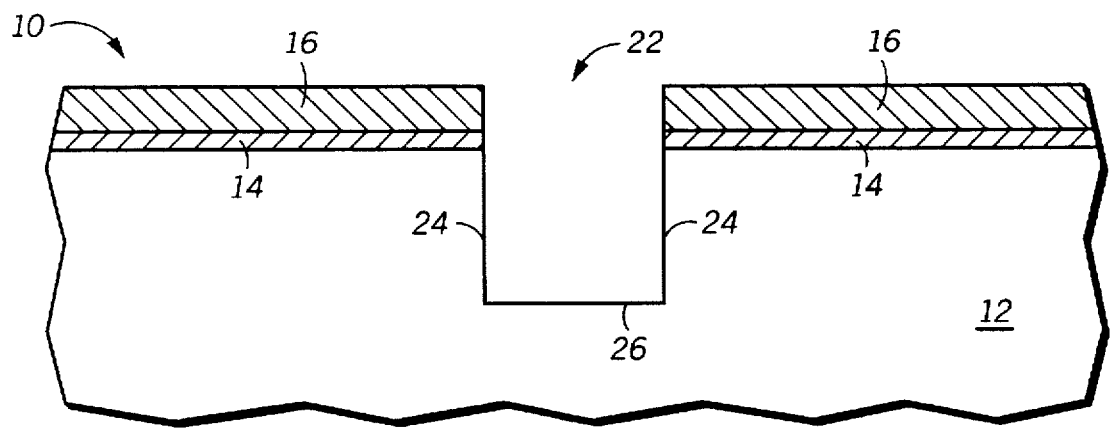

In FIG. 3, first portion 20 of semiconductor substrate 12 is then anisotropically etched using standard etching techniques to form a trench 22 having a trench sidewall 24 and a trench bottom 26. After trench 22 has been formed, photoresist mask 18 is removed using standard photoresist stripping techniques. Trench 22 preferably has a trench width ranging from about 200 to 600 nanometers and a trench depth ranging from about 200 to 1000 nanometers.

Figure 4:
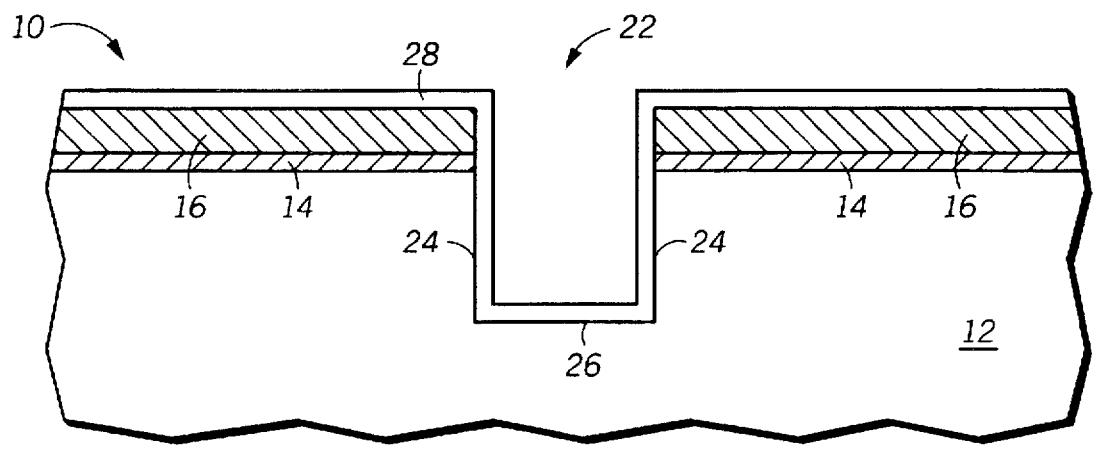

In FIG. 4, a silicon layer 28 is then formed which overlies remaining portion 16 of oxidation resistant layer 15 and lies within trench 22. Silicon layer 28 abuts trench sidewall 24 and trench bottom 26 and has a thickness that is insufficient to fill trench 22. In a preferred embodiment silicon layer 28 is a layer of polysilicon. Alternatively, silicon layer 28 can also be a layer of amorphous silicon. Silicon layer 28 may have a thickness ranging from 5 to 60 nanometers and can be formed using standard deposition techniques.

Figure 5:
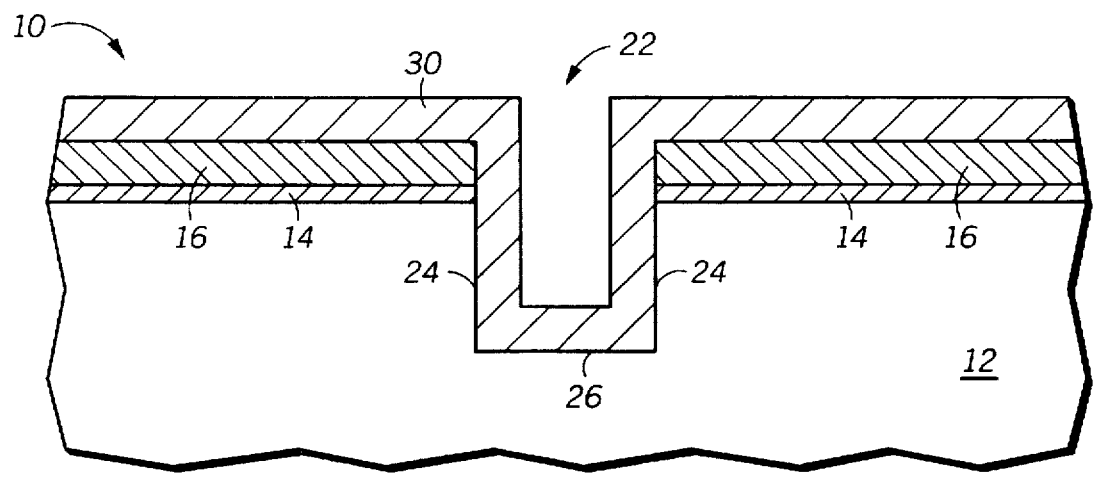

In FIG. 5, silicon layer 28 is then completely oxidized in an ambient comprising oxygen to form a first dielectric layer 30 that lies within trench 22 and overlies remaining portion 16 of oxidation resistant layer 15. First dielectric layer 30 has a thickness that is insufficient to fill trench 22. In a preferred embodiment first dielectric layer 30 is formed using a wet oxidation process. For example, if silicon layer 28 is a layer of polysilicon having a thickness of approximately 30 nanometers then first dielectric layer 30 can be formed by oxidizing the polysilicon layer in an ambient comprising oxygen and hydrogen for approximately 30 minutes at a temperature of approximately 950 degrees Celsius. Alternatively, first dielectric layer 30 can also be formed using a dry oxidation process or a high pressure oxidation process. In addition, a portion of trench sidewall 24 and a portion of trench bottom 26 is also oxidized when first dielectric layer 30 is formed.

Figure 6:
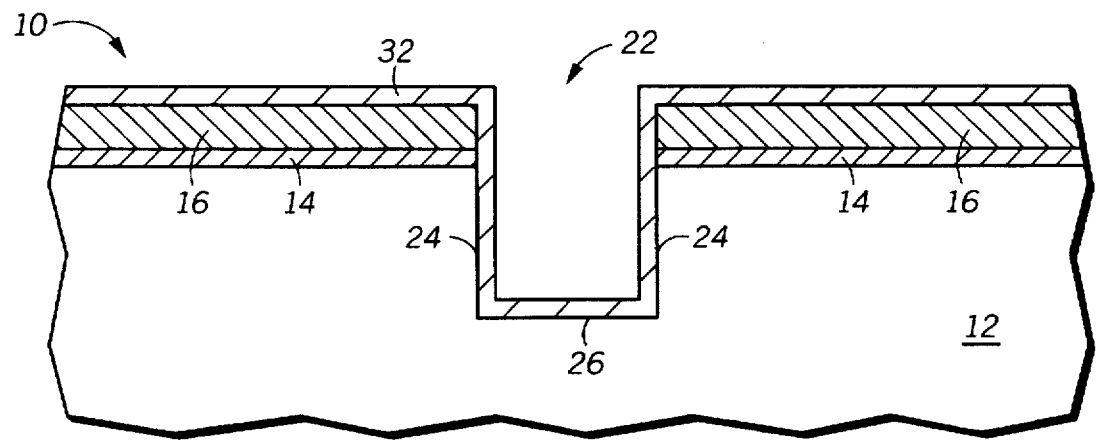

In FIG. 6, first dielectric layer 30 is then isotropically etched to form an etched dielectric layer 32 that lies within trench 22 and overlies remaining portion 16 of oxidation resistant layer 15. As a result of the oxidation process, first dielectric layer 30 is formed with a surface topography that adversely effects the formation of a void free trench. Therefore, in order to overcome this adverse effect a portion of first dielectric layer 30 is removed to form etched dielectric layer 32 that has a surface topography, which is more conducive to the formation of a void free trench fill. In a preferred embodiment first dielectric layer 30 is etched using dilute hydrofluoric acid. For example, if first dielectric layer 30 is formed with a 30 nanometer thick polysilicon layer, then it is preferably etched so that its thickness is reduced by approximately 500 angstroms. After its formation, etched dielectric layer 32 is then annealed in an oxidizing ambient. In a preferred embodiment etched dielectric layer 32 is annealed using a dry oxidation process. For example, etched dielectric layer 32 can be annealed in an ambient comprising dry oxygen for approximately 30 minutes at a temperature of approximately 900 degrees Celsius. It is believed that this anneal improves the electrical reliability of the final trench isolation structure by minimizing stress and fixed charge along trench sidewall 24 and trench bottom 26.

Figure 7:
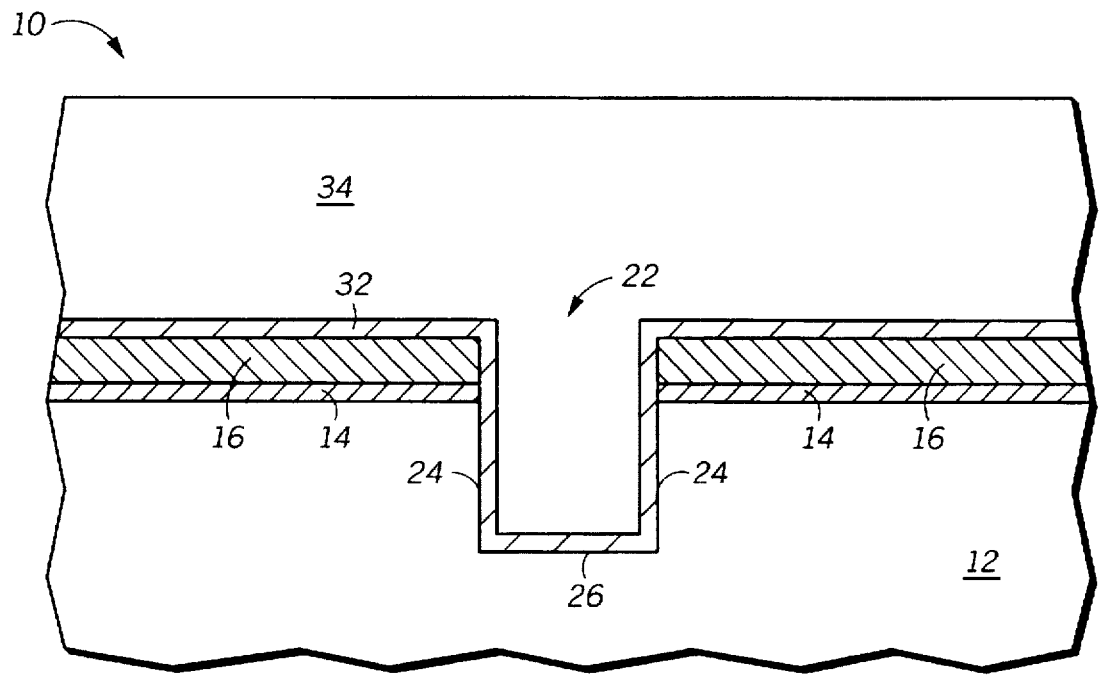

In FIG. 7, a second dielectric layer 34 is then formed overlying etched dielectric layer 32 and substantially fills trench 22. In a preferred embodiment, second dielectric layer 34 is chemically vapor deposited silicon dioxide, which is deposited using ozone and tetraethylorthosilicate (TEOS) as source gases. Alternatively, second dielectric layer 34 can also be another dielectric material, such as germanium oxide, spin-on-glass, et cetera, or a combination of these dielectric materials. In addition, second dielectric layer 34 can be formed using other techniques such as plasma enhanced chemical vapor deposition, electron cyclotron resonance deposition, or spin-on deposition. It has been found that if etched dielectric layer 32 is formed prior to filling trench 22 with second dielectric layer 34, then keyhole or void formation within trench 22 is minimized. Although the reasons for this are not entirely understood, it is believed that the oxidation and etch processes, which form etched dielectric layer 32, create a profile that allows second dielectric layer 34 to be formed within trench 22 such that keyhole or void formation is minimized in trenches having a width of 600 nanometers or less. After its formation second dielectric layer 34 can be annealed in either an inert or an oxidizing ambient in order to densify second dielectric layer 34.

Figure 8:
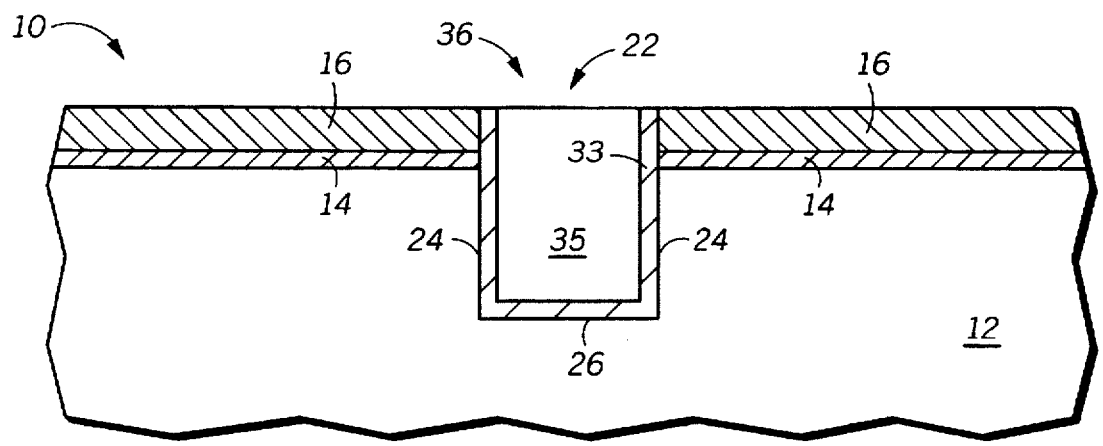

In FIG. 8, a portion of second dielectric layer 34 and a portion of etched dielectric layer 32 are then selectively removed to expose remaining portion 16 of oxidation resistant layer 15, and to form a trench plug 36 within trench 22. As shown in FIG. 8, trench plug 36 comprises a remaining portion 33 of etched dielectric layer 32 and a remaining portion 35 of second dielectric layer 34 and substantially fills trench 22. In one embodiment, chemical mechanical polishing is used to selectively remove a portion of second dielectric layer 34 and a portion of etched dielectric layer 32 to form trench plug 36. Alternatively, standard photo masking and etching techniques can also be used to form trench plug 36. Moreover, trench plug 36 can also be formed using standard photo masking and etching techniques in combination with chemical mechanical polishing. It should be noted that device reliability can be adversely effected by trench plugs that contain keyholes or voids. For example, if the planarization process used to form the trench plug exposes a void that was created during the trench fill process, then a conductive filament or stringer will subsequently be formed within the void during gate electrode formation and adjacent gate electrodes can be shorted to one another via the conductive filament. Therefore, this invention allows device reliability to be improved because it allows void free trench plugs to be formed in trenches having widths of 600 nanometers or less.

Figure 9:
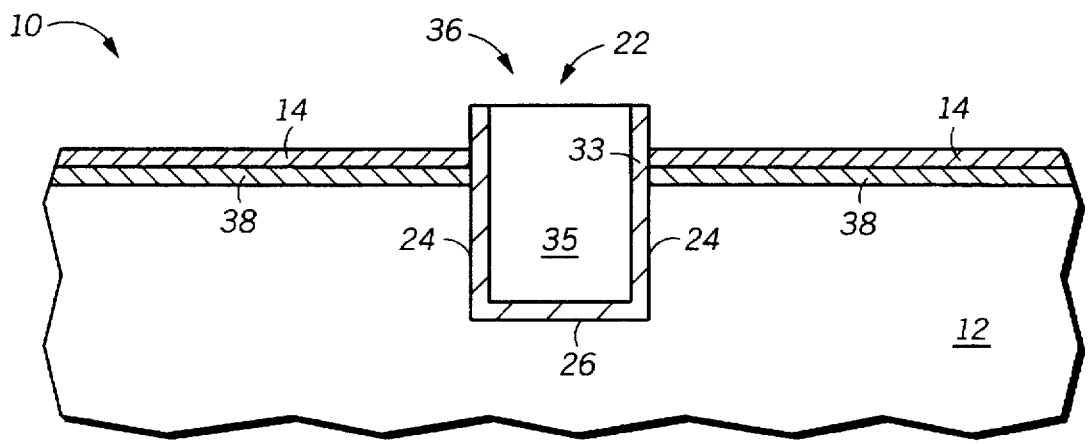

In FIG. 9, remaining portion 16 of oxidation resistant layer 15 is then selectively removed to expose remaining portion 14 of buffer layer 13. In accordance with a preferred embodiment, wherein oxidation resistant layer 15 is silicon nitride, remaining portion 16 can be removed in phosphoric acid. Alternatively, remaining portion 16 can also be removed using standard dry etching techniques. Remaining portion 14 of buffer layer 13 is then annealed in an ambient comprising oxygen to form a sacrificial oxide layer 38 underlying remaining portion 14. In a preferred embodiment sacrificial oxide layer 38 is formed using a dry oxidation process and has a thickness ranging from 10 to 45 nanometers. For example, if remaining portion 14 is thermally grown silicon dioxide having a thickness of approximately 15 nanometers then a sacrificial oxide layer having a thickness of approximately 40 nanometers can be formed by annealing remaining portion 14 in an ambient comprising dry oxygen at a temperature of approximately 1000 degrees Celsius for approximately 40 minutes. It should also be noted that a dry oxidation process allows a thin sacrificial oxide layer to be uniformly and controllably formed. The importance of a dry oxidation process will be more fully understood when sacrificial oxide layer 38 is subsequently removed.

Figure 10:
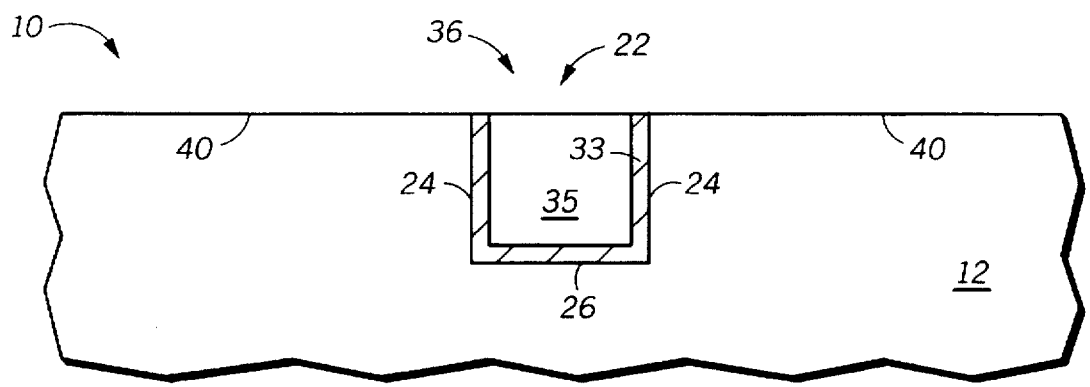

In FIG. 10, remaining portion 14 of buffer layer 13 and sacrificial oxide layer 38 are then removed to expose a second portion 40 of semiconductor substrate 12. In a preferred embodiment, remaining portion 14 and sacrificial oxide layer 38 are isotropically etched using dilute hydrofluoric acid. As shown in FIG. 10, a portion of trench plug 36 is also removed during the etch process. It should be noted that device reliability is also adversely affected when trench plugs are over etched. For example, over etching may expose a significant portion of the trench sidewall, thus creating a vertical surface upon which conductive filaments or stringers will form during subsequent gate electrode formation. Therefore, over etching can cause adjacent gate electrodes to be shorted to one another. More importantly, the gate width of a parasitic transistor formed along the trench sidewall is also dependent on the amount the trench plug is over etched, and therefore, parasitic transistor leakage currents increase as the over etch of the trench plug increases. However, trench plug etching is minimized with the present invention. This is because instead of being etched twice, first to remove remaining portion 14 and then again to remove a subsequently formed sacrificial oxide layer, trench plug 36 is only etched once. Moreover, because sacrificial oxide layer 38 has been controllably and uniformly formed the over etch needed to completely remove it is also minimized. Therefore, leakage currents and gate electrode shorts may be minimized with the present invention, and thus increased device reliability may be achieved.

Figure 11:
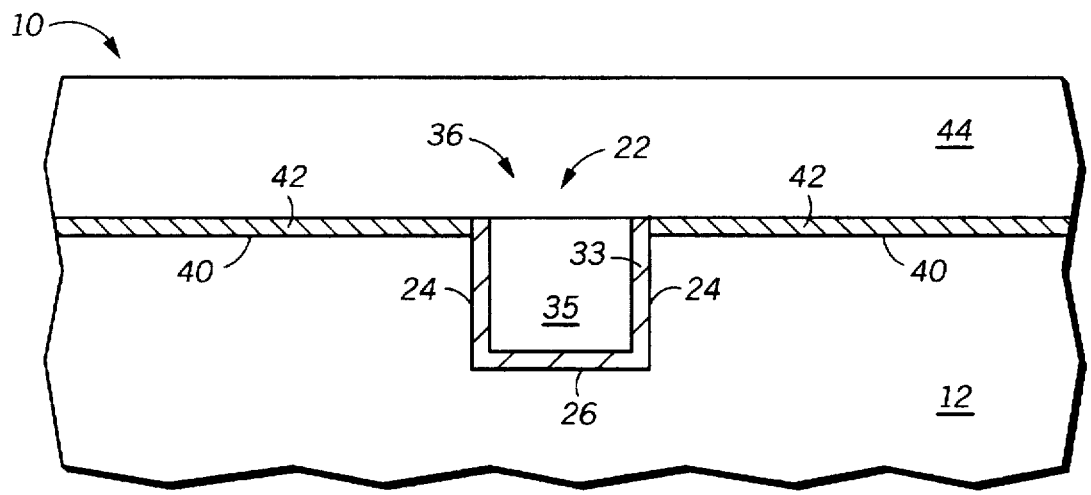

In FIG. 11, a gate dielectric layer 42 is then formed overlying second portion 40 of semiconductor substrate 12. In one embodiment gate dielectric layer 42 is a layer of thermal silicon dioxide, which is formed by thermally oxidizing second portion 40. Alternatively, gate dielectric layer 42 can be another dielectric material such as silicon oxynitride, which can be formed by thermally nitriding a layer of thermal silicon dioxide in an ambient containing ammonia ($NH_3$), nitrous oxide ($N_2O$), or nitric oxide (NO). Moreover, gate dielectric layer 42 can also be formed by direct nitridation of second portion 40 in an ambient containing one of the previously mentioned gases. A conductive layer is then subsequently formed and patterned to form a transistor gate electrode 44 overlying trench plug 36 and gate dielectric layer 42. In a preferred embodiment transistor gate electrode 44 comprises polysilicon. Alternatively, transistor gate electrode 44 can be a metal, a metal silicide or a composite comprising polysilicon and a metal or a metal silicide.

The foregoing description and illustrations contained herein demonstrate many of the advantages associated with the particular invention. In particular, a method for forming trench isolation structures with improved reliability is disclosed. More specifically, the present invention discloses that void or keyhole formation in trenches having submicron trench widths may be minimized by depositing a silicon layer within a trench, oxidizing the silicon layer to form a dielectric layer, and then etching the dielectric layer prior to filling the trench with a dielectric material. In addition, the present invention also teaches that over etching of subsequently formed trench plugs, which adversely effects device reliability, can be minimized by forming a sacrificial oxide layer with a dry oxidation process and then subsequently removing the sacrificial oxide layer at the same time that an overlying buffer layer is removed. Therefore, with the present invention integrated circuits with high device densities and high reliability may be manufactured.

Thus it is apparent that there has been provided, in accordance with the invention, a method for forming a trench isolation structure in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to a specific planarization technique for trench plug formation. Furthermore, the invention is not limited to a specific dielectric layer for trench filling. Therefore, it is intended that this invention encompass all such variations and modifications as fall within the scope of the appended claims.

I claim:

1. A method for forming a trench isolation structure in an integrated circuit comprising the steps of:

providing a semiconductor substrate;

forming a buffer layer overlying the semiconductor substrate;

forming an oxidation resistant layer overlying the buffer layer;

patterning the oxidation resistant layer and the buffer layer to leave a remaining portion of the oxidation resistant layer overlying a remaining portion of the buffer layer, and to form an exposed portion of the semiconductor substrate;

etching the exposed portion of the semiconductor substrate to form a trench, the trench having a trench bottom and a trench sidewall;

forming a silicon layer within the trench and overlying the remaining portion of the oxidation resistant layer, the silicon layer having a thickness insufficient to fill the trench;

oxidizing the silicon layer to form a first dielectric layer, the first dielectric layer overlying the remaining portion of the oxidation resistant layer and lying within the trench, the first dielectric layer having a thickness insufficient to fill the trench;

etching the first dielectric layer to form an etched dielectric layer, where the etched dielectric layer overlies the remaining portion of the oxidation resistant layer, trench sidewall, and the entirety of the trench bottom;

forming a second dielectric layer overlying the etched dielectric layer;

removing a portion of the second dielectric layer to form a trench plug within the trench; and removing the remaining portion of the oxidation resistant layer.

2. The method of claim 1, further comprising the step of annealing the etched dielectric layer in an oxidizing ambient prior to forming the second dielectric layer.

3. The method of claim 1, further comprising the step of annealing the second dielectric layer.

4. The method of claim 1, wherein the step of forming the silicon layer is further characterized as forming a layer of polysilicon.

5. The method of claim 1, wherein the step of forming the silicon layer is further characterized as forming a layer of amorphous silicon.

6. The method of claim 1, wherein the step of removing the portion of the second dielectric layer comprises the step of chemically mechanically polishing the second dielectric layer.

7. The method of claim 1, wherein the step of forming the second dielectric layer is further characterized as depositing a dielectric layer comprising silicon and oxygen.

8. The method of claim 1, wherein the step of forming the silicon layer is further characterized as depositing a silicon layer abutting the trench sidewall and the trench bottom.

9. The method of claim 1, wherein the step of etching the first dielectric layer is further characterized as isotropically etching the first dielectric layer to form the etched dielectric layer.

10. The method of claim 1, wherein the step of forming the oxidation resistant layer is further characterized as depositing a layer of silicon nitride.

11. The method of claim 1, wherein the step of forming the buffer layer comprises the step of oxidizing the semiconductor substrate to form a layer of thermal silicon dioxide.

12. The method of claim 1, wherein the step of removing the remaining portion of the oxidation resistant layer is further characterized as etching the remaining portion of the oxidation resistant layer in phosphoric acid.

13. A method for forming a trench isolation structure in an integrated circuit comprising the steps of:

providing a semiconductor substrate;

forming a buffer layer overlying the semiconductor substrate;

forming an oxidation resistant layer overlying the buffer layer;

patterning the oxidation resistant layer and the buffer layer to leave a remaining portion of the oxidation resistant layer overlying a remaining portion of the buffer layer, and to form a first exposed portion of the semiconductor substrate;

etching the first exposed portion of the semiconductor substrate to form a trench, the trench having a trench bottom and a trench sidewall;

forming a silicon layer within the trench and overlying the remaining portion of the oxidation resistant layer, the silicon layer having a thickness insufficient to fill the trench;

oxidizing the silicon layer to form a first dielectric layer, the first dielectric layer overlying the remaining portion of the oxidation resistant layer and lying within the trench, the first dielectric layer having a thickness insufficient to fill the trench;

etching the first dielectric layer to form an etched dielectric layer, wherein the etched dielectric layer overlies the remaining portion of the oxidation resistant layer, the trench sidewall, and the entirety of the trench bottom;

forming a second dielectric layer overlying the etched dielectric layer;

removing a portion of the second dielectric layer to form a trench plug within the trench;

removing the remaining portion of the oxidation resistant layer to expose the remaining portion of the buffer layer;

annealing the remaining portion of the buffer layer in an oxidizing ambient to form a sacrificial oxide layer underlying the remaining of the buffer layer, wherein the sacrificial layer is formed after the remaining portion of the oxidation resistant layer has been removed;

removing the sacrificial oxide layer to form a second exposed portion of the semiconductor substrate; and forming a gate dielectric layer overlying the second exposed portion of the semiconductor substrate.

14. The method of claim 13, wherein the step of etching the first dielectric layer is further characterized as isotropically etching the first dielectric layer to form the etched dielectric layer.

15. The method of claim 13, further comprising the step of annealing the etched dielectric layer in an oxidizing ambient prior to forming the second dielectric layer.

16. The method of claim 13, further comprising the step of annealing the second dielectric layer.

17. The method of claim 13, wherein the step of forming the silicon layer is further characterized as forming a layer of polysilicon.

18. The method of claim 13, wherein the step of forming the silicon layer is further characterized as forming a layer of amorphous silicon.

19. The method of claim 13, wherein the step of removing the portion of the second dielectric layer comprises the step of chemically mechanically polishing the second dielectric layer.

20. The method of claim 13, wherein the step of forming the second dielectric layer is further characterized as depositing a dielectric layer comprising silicon and oxygen.

21. The method of claim 13, wherein the step of forming the silicon layer is further characterized as depositing a silicon layer abutting the trench sidewall and the trench bottom.

22. The method of claim 13, wherein the step of forming the oxidation resistant layer is further characterized as depositing a layer of silicon nitride.

23. The method of claim 13, wherein the step of forming the buffer layer comprises the step of oxidizing the semiconductor substrate to form a layer of thermal silicon dioxide.

24. The method of claim 13, wherein the step of removing the remaining portion of the oxidation resistant layer is further characterized as etching the remaining portion of the oxidation resistant layer in phosphoric acid.

25. The method of claim 13, wherein the step of removing the sacrificial oxide layer is further characterized as isotropically etching the sacrificial oxide layer.

* * * * *